United States Patent
Belau et al.

(10) Patent No.: US 10,847,374 B2
(45) Date of Patent: Nov. 24, 2020

(54) METHOD FOR ETCHING FEATURES IN A STACK

(71) Applicant: Lam Research Corporation, Fremont, CA (US)

(72) Inventors: Leonid Belau, Pleasanton, CA (US); Eric Hudson, Berkeley, CA (US); Francis Sloan Roberts, Redwood City, CA (US)

(73) Assignee: Lam Research Corporation, Fremont, CA (US)

( * ) Notice: Subject to any disclaimer, the term of this patent is extended or adjusted under 35 U.S.C. 154(b) by 22 days.

(21) Appl. No.: 15/798,831

(22) Filed: Oct. 31, 2017

(65) Prior Publication Data

US 2019/0131135 A1 May 2, 2019

(51) Int. Cl.
*H01L 21/3065* (2006.01)
*H01L 21/311* (2006.01)
*H01L 21/308* (2006.01)

(52) U.S. Cl.
CPC ........ *H01L 21/3065* (2013.01); *H01L 21/308* (2013.01); *H01L 21/31116* (2013.01); *H01L 21/31144* (2013.01)

(58) Field of Classification Search
CPC ........... H01L 21/3065; H01L 21/31116; H01L 21/308; H01L 21/31144
See application file for complete search history.

(56) References Cited

U.S. PATENT DOCUMENTS

| | | |
|---|---|---|
| 3,704,511 A | 12/1972 | Hooker |
| 3,899,711 A | 8/1975 | Lemmond |
| 4,200,794 A | 4/1980 | Newberry et al. |
| 4,419,580 A | 12/1983 | Walker et al. |
| 4,873,445 A | 10/1989 | Le Jeune |
| 4,894,696 A | 1/1990 | Takeda |
| 5,284,544 A | 2/1994 | Mizutani et al. |
| 5,767,018 A | 6/1998 | Bell |

(Continued)

FOREIGN PATENT DOCUMENTS

| | | |
|---|---|---|
| CA | 1157511 | 11/1983 |
| CA | 1184239 | 3/1985 |

(Continued)

OTHER PUBLICATIONS

S. Wolf and R.N. Tauber, (Silicon Processing for the VLSI Era, vol. 1—Process Technology, Lattice Press, 1986)(pp. 542-557) (Year: 1986).*

(Continued)

*Primary Examiner* — Duy Vu N Deo
*Assistant Examiner* — Mahmoud Dahimene
(74) *Attorney, Agent, or Firm* — Beyer Law Group LLP

(57) ABSTRACT

A method for etching features in a stack below a carbon containing mask is provided. The stack is cooled to a temperature below −20° C. An etch gas is provided comprising a free fluorine providing component, a hydrogen containing component, a hydrocarbon containing component, and a fluorocarbon containing component. A plasma is generated from the etch gas. A bias is provided with a magnitude of at least about 400 volts to accelerate ions from the plasma to the stack. Features are selectively etched in the stack with respect to the carbon containing mask.

13 Claims, 4 Drawing Sheets

(56) References Cited

U.S. PATENT DOCUMENTS

| | | | |
|---|---|---|---|
| 5,948,704 A | 9/1999 | Benjamin et al. | |
| 6,176,667 B1 | 1/2001 | Fairbairn et al. | |
| 6,235,643 B1* | 5/2001 | Mui | H01L 21/3065 156/345.24 |
| 6,547,977 B1 | 4/2003 | Yan | |
| 6,617,595 B1 | 9/2003 | Okunuki | |
| 6,841,943 B2 | 1/2005 | Vahedi et al. | |
| 7,037,846 B2 | 5/2006 | Srivastava et al. | |
| 7,105,390 B2 | 9/2006 | Brask et al. | |
| 7,416,989 B1 | 8/2008 | Liu et al. | |
| 7,732,728 B2 | 6/2010 | Dhindsa et al. | |
| 7,740,736 B2 | 6/2010 | Fischer et al. | |
| 7,951,683 B1 | 5/2011 | Shanker | |
| 7,977,249 B1 | 7/2011 | Liu et al. | |
| 7,977,390 B2 | 7/2011 | Ji et al. | |
| 7,981,763 B1 | 7/2011 | van Schravendijk et al. | |
| 8,058,179 B1 | 11/2011 | Draeger et al. | |
| 8,187,486 B1 | 5/2012 | Liu et al. | |
| 8,552,334 B2 | 10/2013 | Tappan et al. | |
| 8,608,973 B1 | 12/2013 | Guha | |
| 8,617,411 B2 | 12/2013 | Singh | |
| 8,658,511 B1 | 2/2014 | Fulgenico | |
| 9,378,971 B1 | 6/2016 | Briggs et al. | |
| 9,384,998 B2 | 7/2016 | Hudson et al. | |
| 9,406,535 B2 | 8/2016 | Berry, III et al. | |
| 9,536,748 B2 | 1/2017 | Berry, III et al. | |
| 9,543,148 B1 | 1/2017 | Hudson et al. | |
| 9,543,158 B2 | 1/2017 | Hudson et al. | |
| 9,548,188 B2 | 1/2017 | Hausmann | |
| 9,620,377 B2 | 4/2017 | Hudson et al. | |
| 9,887,097 B2 | 2/2018 | Hudson | |
| 9,997,372 B2 | 6/2018 | Briggs et al. | |
| 9,997,373 B2 | 6/2018 | Hudson | |
| 2003/0003755 A1 | 1/2003 | Donohoe | |
| 2003/0168588 A1 | 9/2003 | Brailove et al. | |
| 2004/0084410 A1 | 5/2004 | Lenz | |
| 2005/0136682 A1 | 6/2005 | Hudson et al. | |
| 2005/0199822 A1 | 9/2005 | Saini et al. | |
| 2005/0211926 A1 | 9/2005 | Ito et al. | |
| 2006/0121721 A1 | 6/2006 | Lee et al. | |
| 2006/0192104 A1 | 8/2006 | Schultz et al. | |
| 2006/0226120 A1 | 10/2006 | Rusu | |
| 2007/0026677 A1 | 2/2007 | Ji et al. | |
| 2007/0049018 A1 | 3/2007 | Sandhu | |
| 2007/0063337 A1 | 3/2007 | Schubert et al. | |
| 2007/0068624 A1 | 3/2007 | Jeon et al. | |
| 2007/0181820 A1 | 8/2007 | Hwang et al. | |
| 2008/0132046 A1 | 6/2008 | Walther | |
| 2008/0179186 A1 | 7/2008 | Shimura et al. | |
| 2008/0286978 A1 | 11/2008 | Chen et al. | |
| 2009/0163035 A1 | 6/2009 | Romano et al. | |
| 2009/0203218 A1 | 8/2009 | Matsuyama | |
| 2009/0275202 A1 | 11/2009 | Tanaka et al. | |
| 2010/0009543 A1 | 1/2010 | Cho | |
| 2010/0173494 A1 | 7/2010 | Kobrin | |
| 2011/0100954 A1 | 5/2011 | Satake et al. | |
| 2011/0151670 A1 | 6/2011 | Lee et al. | |
| 2011/0201208 A1 | 8/2011 | Kawakami | |
| 2011/0207323 A1 | 8/2011 | Ditizio | |
| 2012/0288799 A1 | 11/2012 | Takase et al. | |
| 2013/0137275 A1* | 5/2013 | Tong | H01L 21/32134 438/722 |
| 2013/0157470 A1 | 6/2013 | Watanabe et al. | |
| 2013/0216959 A1 | 8/2013 | Tanaka et al. | |
| 2013/0316518 A1 | 11/2013 | Hollister et al. | |
| 2014/0021343 A1 | 1/2014 | Kirkpatrick et al. | |
| 2014/0038412 A1 | 2/2014 | Hu et al. | |
| 2014/0043216 A1 | 2/2014 | Tang | |
| 2014/0065838 A1 | 3/2014 | Ellinger et al. | |
| 2014/0076716 A1 | 3/2014 | Gorokhovsky et al. | |
| 2014/0220785 A1 | 8/2014 | Watanabe et al. | |
| 2014/0335679 A1 | 11/2014 | Liu | |
| 2014/0356985 A1 | 12/2014 | Ricci et al. | |
| 2015/0050807 A1 | 2/2015 | Wu et al. | |
| 2015/0083582 A1 | 3/2015 | Dhindsa et al. | |
| 2015/0179393 A1 | 6/2015 | Colvin et al. | |
| 2015/0270140 A1 | 9/2015 | Gupta | |
| 2015/0311292 A1 | 10/2015 | Srinivasan et al. | |
| 2015/0348792 A1 | 12/2015 | Lee | |
| 2016/0049281 A1 | 2/2016 | Berry, III et al. | |
| 2016/0064232 A1 | 3/2016 | Berry, III et al. | |
| 2016/0064260 A1 | 3/2016 | Berry, III et al. | |
| 2016/0111294 A1 | 4/2016 | Berry, III et al. | |
| 2016/0163556 A1 | 6/2016 | Briggs et al. | |
| 2016/0163557 A1 | 6/2016 | Hudson et al. | |
| 2016/0163558 A1 | 6/2016 | Hudson et al. | |
| 2016/0163561 A1 | 6/2016 | Hudson et al. | |
| 2016/0181117 A1 | 6/2016 | Arghavani | |
| 2016/0218015 A1 | 7/2016 | Oomori | |
| 2016/0260617 A1 | 9/2016 | Hudson et al. | |
| 2016/0260620 A1 | 9/2016 | Briggs et al. | |
| 2016/0268141 A1 | 9/2016 | Hudson | |
| 2016/0307781 A1 | 10/2016 | Berry, III et al. | |
| 2016/0343580 A1 | 11/2016 | Hudson | |
| 2016/0351407 A1 | 12/2016 | Sawataishi | |
| 2016/0379856 A1 | 12/2016 | Tomura | |
| 2017/0062181 A1 | 3/2017 | Berry, III et al. | |
| 2017/0076945 A1 | 3/2017 | Hudson et al. | |
| 2017/0076955 A1 | 3/2017 | Hudson et al. | |
| 2017/0170026 A1 | 6/2017 | Hudson et al. | |
| 2017/0178920 A1 | 6/2017 | Dole et al. | |
| 2017/0229316 A1* | 8/2017 | Surla | H01L 21/31144 |
| 2018/0286707 A1 | 10/2018 | Hudson et al. | |

FOREIGN PATENT DOCUMENTS

| | | |
|---|---|---|
| CN | 1661762 A | 8/2005 |
| JP | 06-208837 A | 7/1994 |
| KR | 10-2006-0030717 | 4/2006 |
| KR | 10-2011-0097193 A | 8/2011 |
| WO | 2013/012620 | 1/2013 |

OTHER PUBLICATIONS

Nikolaos V. Mantzaris et al. (Radio-frequency plasmas in CF 4: Self-consistent modeling of the plasma physics and chemistry, J. Appl. Phys. n (12). Jun. 15, 1995 (pp. 6169-6180)) Used Only As Evidence. (Year: 1995).*

Jim McVittie "Tutorial on Using RF to Control DC Bias" (2007) found in Web-page "https://nccavs-usergroups.avs.org/wp-content/uploads/PAG2007/PEUG_07_5_McVittie.pdf" Used Only As Evidence. (Year: 2007).*

Hanson et al. (2003) "Bonding Self-Assembled, Compact Organophosphonate Monolayers to the Native Oxide Surface of Silicon," *J. Am. Chem. Soc.*,125(51): 16074-16080.

Jung et al. (2005) "Vapor-Phase Self-Assembled Monolayer for Improved Mold Release in Nanoimprint Lithography," *Langmuir*, 21(4):1158-1161.

Yang et al. (2006) "CVD Growth Kinetics of HfB$_2$ Thin Films from the Single-Source Precursor Hf(BH$_4$)$_4$," *Chem. Mater., American Chemical Society*, 18(21):5088-5096.

Yanguas-Gil et al. (Sep./Oct. 2009) "Highly conformal film growth by chemical vapor deposition. II. Conformality enhancement through growth inhibition," *Journal of Vacuum Science & Technology A*, 27(5):1244-1248.

Zhuang et al. (2006) "Thermal stability of vapor phase deposited self-assembled monolayers for MEMS anti-stiction," *J. Micromech. Microeng.*, 16:2259-2264.

Zhou, Han and Bent, Stacey F. (Jul./Aug. 2013) "Fabrication of organic interfacial layers by molecular layer deposition: Present status and future opportunities," *Journal of Vacuum Science Technology A*, American Vacuum Society, 31(4), 040801-1-040801-18.

Ohiwa, et al. (1992) "SiO$_2$ Tapered Etching Employing Magnetron Discharge of Fluorocarbon Gas," *Jpn. J. Appl. Phys.*, vol. 31, Part 1, No. 2A, pp. 405-410.

Ohiwa, et al. (1990) "SiO$_2$ Tapered Etching Employing Magnetron Discharge," *Dry Process Symposium*, V-3, pp. 105-109.

Engelhardt, et al. (1988) "Deep Trench Etching Using CBrF$_3$ and CBrF$_3$/Chlorine Gas Mixture," Siemens AG, Otto-Hahn-Ring, 8000 Munich 83, Germany, pp. 48-54.

(56) References Cited

OTHER PUBLICATIONS

Matsuo, S., "Selective Etching of Si Relative to $SiO_2$ Without Undercutting by CBrF3 Plasma," American Institute of Physics, Appl. Phys. Lett., 36(9), May 1, 1980, 4 pp.
Briggs et al. U.S. Appl. No. 15/069,022, filed May 10, 2017.
Notice of Allowance for Briggs et al. U.S. Appl. No. 15/069,022, filed May 10, 2017.
Office Action from U.S. Appl. No. 15/903,865 dated Sep. 27, 2018.

* cited by examiner

METHOD FOR ETCHING FEATURES IN A STACK

INCORPORATION BY REFERENCE

The present disclosure incorporates by reference for all purposes the patent application entitled "GAS ADDITIVES FOR SIDEWALL PASSIVATION DURING HIGH ASPECT RATIO CRYOGENIC ETCH" by Hudson et al. filed on Mar. 30, 2017, U.S. application Ser. No. 15/475,021.

BACKGROUND

Field

The disclosure relates to a method of forming semiconductor devices on a semiconductor wafer. More specifically, the disclosure relates to etching a stack in the formation of memory.

In forming semiconductor devices, etch layers may be etched to form memory holes or lines. Some semiconductor devices may be formed by etching a stack of bilayers of silicon oxide and silicon nitride (ONON). Such stacks may be used in memory applications, such as in forming dynamic random access memory (DRAM) and three dimensional "negative and" gates (3D NAND).

SUMMARY

To achieve the foregoing and in accordance with the purpose of the present disclosure, a method for etching features in a stack below a carbon containing mask is provided. The stack is cooled to a temperature below −20° C. An etch gas is provided comprising a free fluorine providing component, a hydrogen containing component, a hydrocarbon containing component, and a fluorocarbon containing component. A plasma is generated from the etch gas. A bias is provided with a magnitude of at least about 400 volts to accelerate ions from the plasma to the stack. Features are selectively etched in the stack with respect to the carbon containing mask.

These and other features of the present disclosure will be described in more details below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
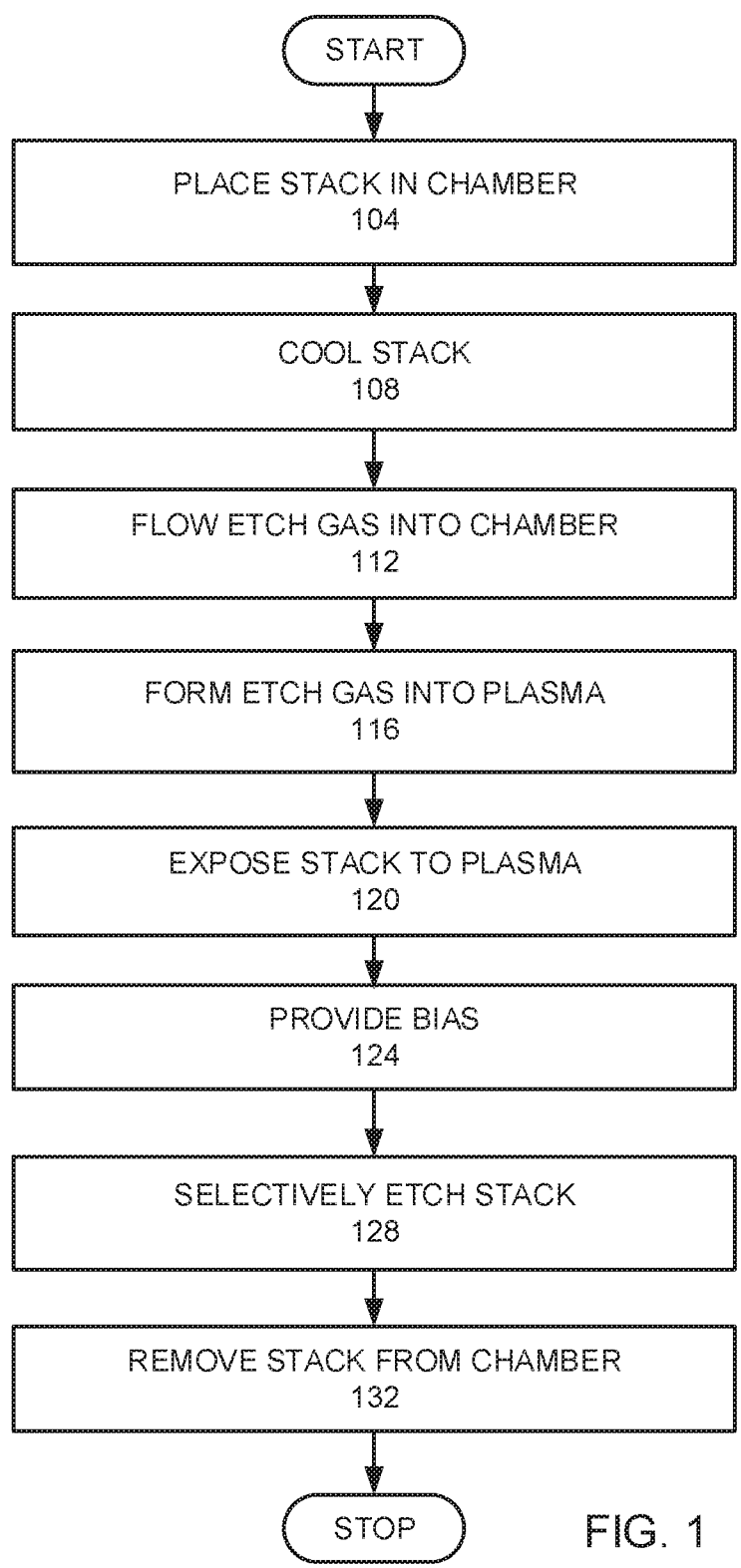
FIG. 1 is a high level flow chart of an embodiment.

FIG. 1 is a high level flow chart of an embodiment. In this embodiment, a stack is placed in an etch chamber (step 104). The stack is disposed below a carbon containing patterned mask. The stack is cooled to a temperature below −20° C. (step 108). An etch gas is provided by flowing the etch gas into the etch chamber, wherein the etch gas comprises a free fluorine providing component, a hydrogen containing component, a hydrocarbon containing component, and a fluorocarbon containing component (step 112). The etch gas is formed into an etch plasma (step 116). The stack is exposed to the plasma (step 120). A bias is provided with a magnitude of at least 400 volts to accelerate ions from the plasma to the stack (step 124). The stack is selectively etched with respect to the carbon containing patterned mask by the etch plasma (step 128). The stack is removed from the etch chamber (step 132).

EXAMPLE

Figure 2A:
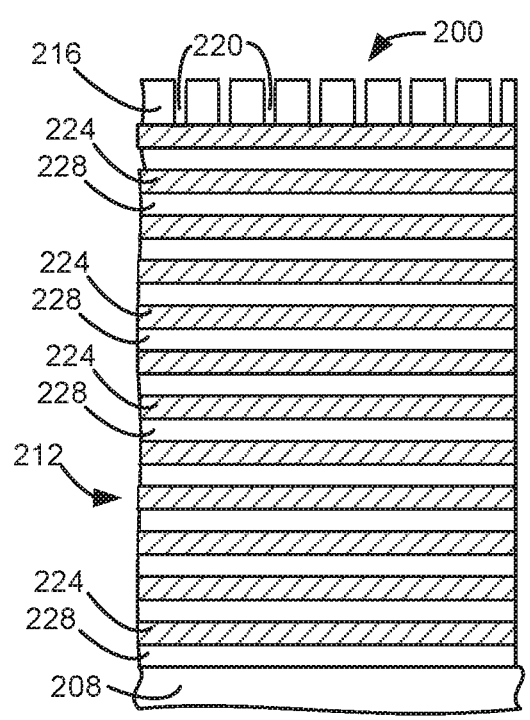
FIGS. 2A-B are schematic cross-sectional views of a stack processed according to an embodiment.

In an exemplary embodiment, a stack is placed in an etch chamber (step 104). FIG. 2A is a schematic cross-sectional view of a stack 200, which in this embodiment comprises a substrate 208 under a plurality of bilayers 212, which is disposed below a carbon containing patterned mask 216. In this example, one or more layers may be disposed between the substrate 208 and the plurality of bilayers 212 or the plurality of bilayers 212 and the carbon containing patterned mask 216. However, this embodiment does not have a silicon containing mask above the plurality of bilayers 212 or above the carbon containing patterned mask 216. In this example, the carbon containing patterned mask 216 is amorphous carbon. In this example, patterned mask pattern provides mask features 220 for high aspect ratio contacts. In some embodiments, the mask features are formed before the substrate is placed in the etch chamber. In other embodiments, the mask features 220 are formed while the substrate is in the etch chamber. In this embodiment, the plurality of bilayers 212 are bilayers of a layer of silicon oxide 224 and a layer of silicon nitride 228.

Figure 3:
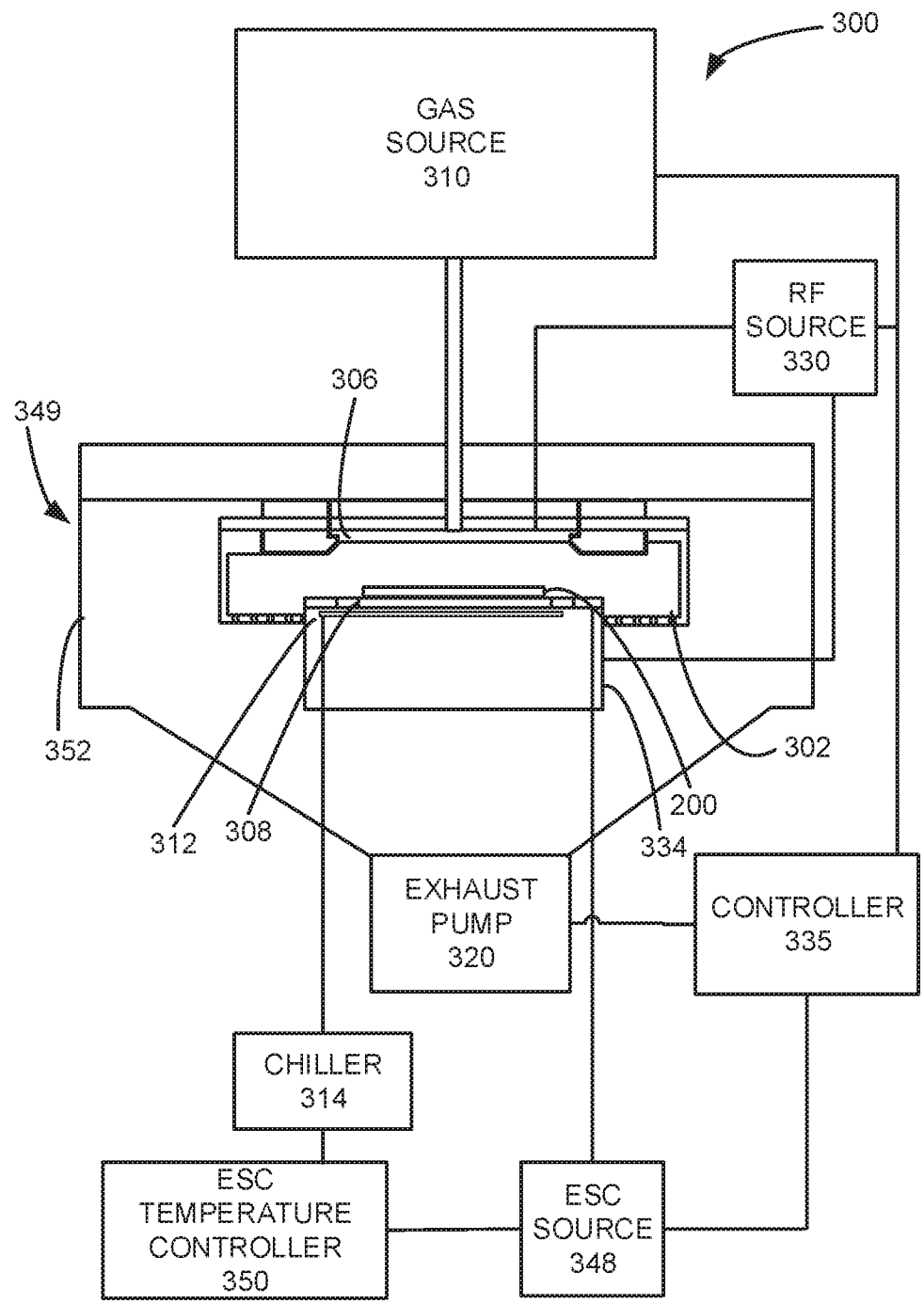
FIG. 3 is a schematic view of a etch chamber that may be used in an embodiment.

FIG. 3 is a schematic view of an etch reactor that may be used in an embodiment. In one or more embodiments, an etch reactor 300 comprises a gas distribution plate 306 providing a gas inlet and an electrostatic chuck (ESC) 308, within an etch chamber 349, enclosed by a chamber wall 352. Within the etch chamber 349, a stack 200 is positioned on over the ESC 308. The ESC 308 may provide a bias from the ESC source 348. An etch gas source 310 is connected to the etch chamber 349 through the distribution plate 306. An ESC temperature controller 350 is connected to a chiller 314. In this embodiment, the chiller 314 provides a coolant to channels 312 in or near the ESC 308. A radio frequency (RF) source 330 provides RF power to a lower electrode and/or an upper electrode, which in this embodiment are the ESC 308 and the gas distribution plate 306. In an exemplary embodiment, 400 kHz, 60 MHz, and optionally 2 MHz, 27 MHz power sources make up the RF source 330 and the ESC source 348. In this embodiment, the upper electrode is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. A controller 335 is controllably connected to the RF source 330, the ESC source 348, an exhaust pump 320, and the etch gas source 310. An example of such a etch chamber is the Exelan Flex™ etch system manufactured by Lam Research Corporation of Fremont, Calif. The process chamber can be a CCP (capacitive coupled plasma) reactor or an ICP (inductive coupled plasma) reactor.

Figure 4:
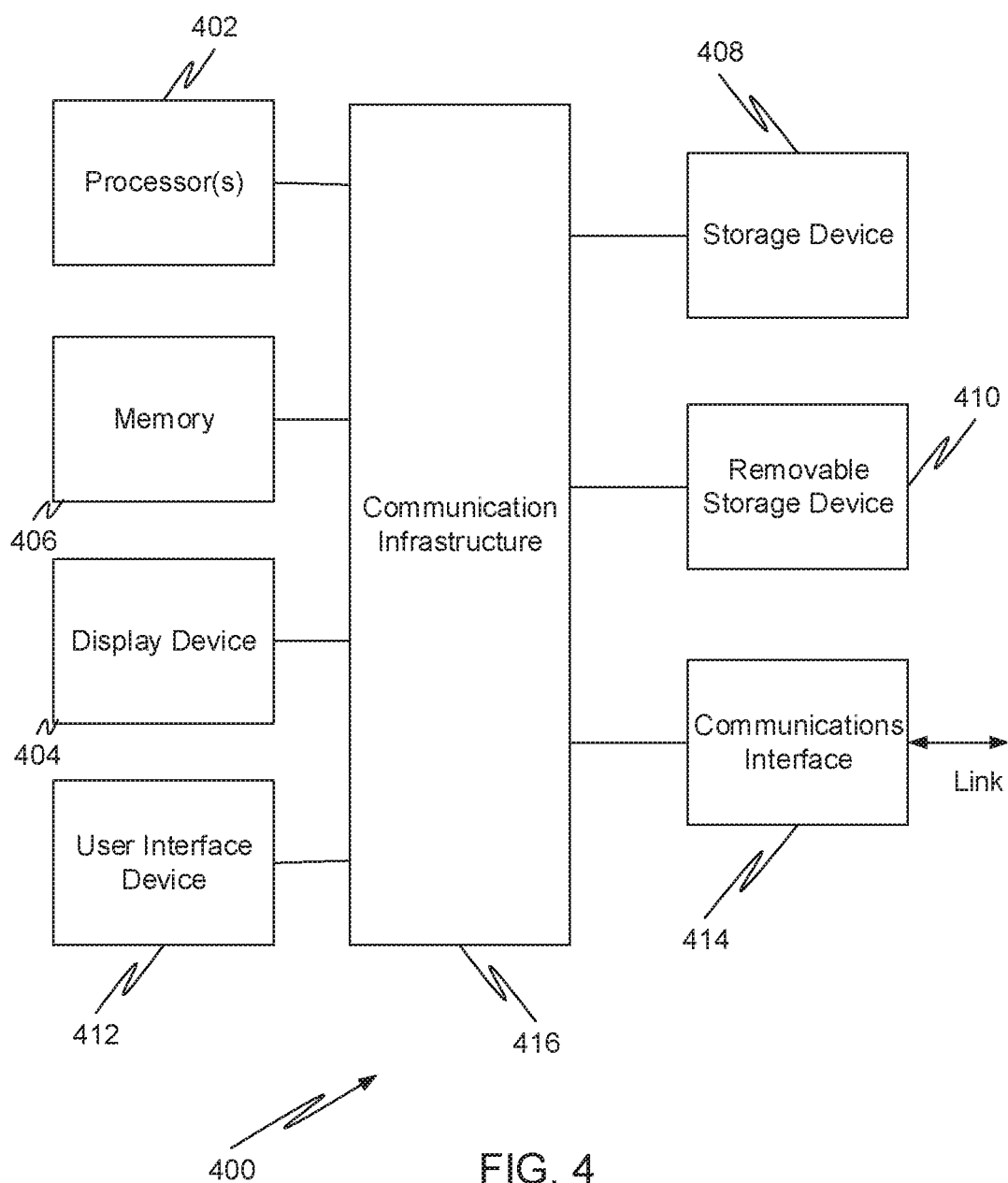
FIG. 4 is a schematic view of a computer system that may be used in practicing an embodiment.

FIG. 4 is a high level block diagram showing a computer system 400, which is suitable for implementing a controller 335 used in embodiments. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

After the stack 200 has been placed into the etch chamber 300, the stack is cooled to a temperature below −20° C. (step 108). An etch gas comprising a free fluorine providing component, a hydrogen containing component, a hydrocarbon containing component, and a fluorocarbon containing component is flowed into the etch chamber (step 112). In this example, the etch gas is 2-150 sccm $NF_3$, 20-300 sccm $H_2$, 2-40 sccm $CF_3I$, 10-60 sccm $CH_3F$, and 0-100 sccm $CH_2F_2$. In this example, a pressure of 5 to 60 mTorr is provided. The etch gas is formed into an etch plasma (step 116). This may be accomplished by providing an excitation RF with a frequency of 60 MHz at 200 to 8000 watts. The stack 200 is exposed to the plasma (step 120). A bias with a magnitude of at least about 400 volts is provided (step 124). In this embodiment, the high bias is provided by providing an RF with a frequency of 400 kHz at 2 kW to 18 kW. The bias causes ions to be accelerated to the stack 200 causing the selective etching of high aspect ratio etch features into the stack 200 with respect to the carbon containing patterned mask (step 128). The plasma is maintained for 180 to 3600 seconds. The etch is able to etch both the silicon oxide and silicon nitride layers. The substrate is then removed from the etch chamber (step 132).

Figure 2B:
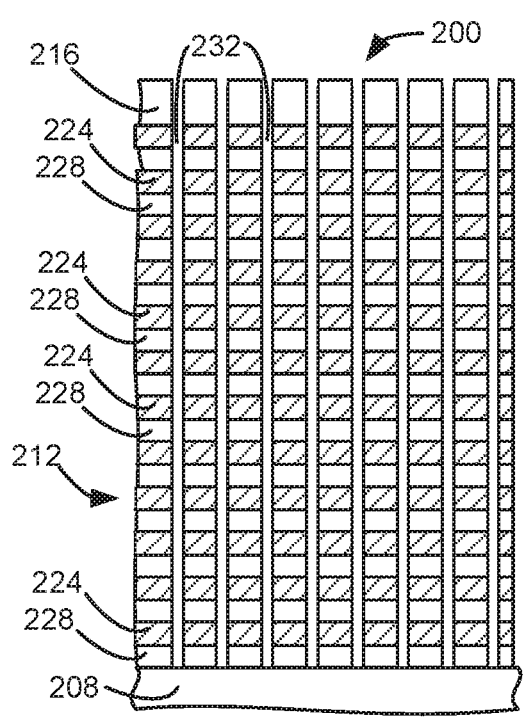

FIG. 2B is a cross-sectional view of the stack 200 after the contacts 232 have been etched. The contacts are high aspect ratio contacts. Preferably, the high aspect ratio contacts have a height to CD width ratio of greater than 100:1. More preferably, the contacts have a etch depth to neck aspect ratio of greater than 30:1.

The etch process is able to selectively etch the silicon oxide and silicon nitride layers with respect to amorphous carbon with a selectivity of greater than 5:1, while etching high aspect ratio features. The resulting features also have reduced bowing, striation, distorting, capping, and tapering. In addition, this embodiment allows the use of a carbon containing patterned mask, such as amorphous carbon, without requiring a silicon containing mask such as polysilicon, which reduces costs and defects.

Previous processes that use an etch, where the stack is processed at a temperature above −20° C., relied on a fluorocarbon chemistry to etch and provide sidewall protection. Such a process resulted in a mask to silicon oxide and silicon nitride etch selectivity of less than 5:1. Sidewall protection was provided by polymer deposition, which is controlled by the concentration of carbon, where a higher concentration of carbon increases sidewall deposition, and by oxygen, where a higher concentration of oxygen consumes the deposited polymer. The higher concentration of oxygen also increased the consumption of the mask. Some previous processes used a silicon containing mask.

The above embodiment increases etch rate and improves contact shape/striation compared to a conventional approach. Without being bound by theory, it is proposed that a fluorine-rich fluorocarbon polymer at the high aspect ratio etch front is enabled by the lower wafer temperature. This increases the silicon oxide and silicon nitride etch rate, while building up less carbon at the etch front. A reduced carbon-rich polymer buildup at the etch front also improves contact shape and reduces sidewall striation. In addition, the higher selectivity of silicon oxide and silicon nitride to carbon mask could be achieved. This allows for the use of a thinner carbon containing mask, which improves control and performance of the carbon mask open process.

In some embodiments, to cool the stack to a temperature below −20° C., the electrostatic chuck is cooled to a temperature below −60° C. In other embodiments, it is believed that when the chuck is cooled to a temperature between −30° C. to −200° C. the process is improved. In other embodiments, the chuck is cooled to a temperature below −40° C. to −200° C. In some embodiments, the stack is cooled to a temperature between −30° C. to −200° C.

In some embodiments, the etch gas comprises a free fluorine providing component, a hydrogen containing component, a hydrocarbon containing component, and a fluorocarbon containing component and an iodine containing component. A free fluorine providing component is defined as a component that will normally break down in plasma to provide free-fluorine, such as $NF_3$ and $SF_6$. Hydrogen containing components are preferably $H_2$, $CH_3F$ and $CH_2F_2$. In addition, various components may form a single polyatomic molecule. For example, $CF_3I$ may provide both the fluorocarbon containing component and the iodine containing component. In addition, a hydrofluorocarbon-containing component may provide the hydrocarbon containing component and the fluorocarbon containing component. Iodine containing components may be selected from the group comprising at least one of trifluoroiodomethane ($CF_3I$), pentafluoroiodoethane ($C_2IF_5$), tetrafluorodiiodoethane ($C_2I_2F_4$). Without being bound by theory, it is believed that the iodine from the iodine containing component provides an improved sidewall passivation, which helps to reduce bowing. By using a low substrate temperature in combination with certain reactants, a high quality protective film can be formed on sidewalls of the partially etched features during etching. The low temperature also allows some embodiments where the etch gas is oxygen free and free from both $C_4F_8$, $C_4F_6$, and $C_3F_8$. In other embodiments, the etch gas comprises $NF_3$, $H_2$, $CF_3I$, $CH_3F$, and $CH_2F_2$. In some of the embodiments, the etch gas further comprises at least one of $C_4F_8$, $C_4F_6$, $C_3F_8$, $SF_6$, $CF_4$, $CH_4$, or $CHF_3$.

The ONON stack may be etched to form contact holes or trenches in making a 3D NAND memory device. Other embodiments may etch contact holes to be used in MOC and MOA, which are first metal contacts used to control 3D NAND junctions. Other embodiments may be used for DRAM Capacitor etching. Embodiments provide for a CD less than 100 nm with an etch depth of greater than 20 microns. In other embodiments, the etch depth is greater than 3 microns. Such embodiments allow the etching of at least 48 bilayers of silicon oxide and silicon nitride in a single etch step using a single amorphous carbon mask with a thickness of less than 1 microns.

In some embodiments, the stack may be a single layer of silicon oxide or silicon nitride. In other embodiments, the stack may be a single layer or multiple layers of other silicon containing materials.

The above embodiment used a bias with a magnitude of at least 400 volts. It has been found that a bias with a magnitude of at least 1000 volts would provide an improved etch. It is believed that a bias with a magnitude of at least 2000 volts would provide a further improved etch. Without being bound by theory it is believed that the higher bias would allow for a higher aspect ratio etch, while taking advantage of other features, which allows for the use of an amorphous carbon mask and reducing striation and bowing.

In some embodiments, liquid nitrogen is used as a coolant that is flowed through the chuck or bottom electrode to provide cooling. In other embodiments, liquid Vertel Sinera™ manufactured by DuPont Corporation of Wilmington, Del. may be used as the coolant.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for etching features in a stack below an amorphous carbon mask, comprising:
    cooling the stack to a temperature below $-20°$ C.;
    providing an etch gas mixture comprising a free fluorine providing component gas, a $H_2$ gas, and a gas mixture comprising, a hydrocarbon containing component and a fluorocarbon containing component, wherein the fluorocarbon containing component comprises one of a fluorocarbon gas, hydrofluorocarbon gas or a gas of a fluorocarbon with an iodine component;
    generating a plasma from the etch gas mixture;
    providing a bias with a magnitude of at least about 400 volts to accelerate ions from the plasma to the stack; and
    selectively etching features in the stack with respect to the amorphous carbon mask.

2. The method, as recited in claim 1, wherein the etch gas mixture further comprises an iodine containing component.

3. The method, as recited in claim 1, wherein the etch gas mixture is oxygen free and free from both $C_4F_8$ and $C_4F_6$.

4. The method, as recited in claim 1, wherein the etch gas mixture comprises $NF_3$, $H_2$, $CF_3I$, $CH_3F$, and $CH_2F_2$.

5. The method, as recited in claim 4, wherein the etch gas mixture further comprises at least one of $C_4F_8$, $C_3F_8$, $C_4F_6$, $SF_6$, $O_2$, $CF_4$, $CH_4$, or $CHF_3$.

6. The method, as recited in claim 1, wherein the stack is supported on a chuck in an etch chamber, the method further comprising cooling the chuck to a temperature below $-40°$ C.

7. The method, as recited in claim 1, wherein and the stack includes a plurality of silicon oxide and silicon nitride bilayers.

8. The method, as recited in claim 7, wherein the plurality of silicon oxide and silicon nitride bilayers include at least 48 bilayers.

9. The method, as recited in claim 7, wherein the stack does not have a silicon containing mask.

10. The method, as recited in claim 1, wherein the etch gas mixture further comprises $NF_3$.

11. The method, as recited in claim 1, wherein the etch gas mixture further comprises $CF_3I$.

12. The method, as recited in claim 1, wherein the features have a depth to neck aspect ratio of at least 30:1.

13. The method, as recited in claim 1, wherein the etch gas mixture further comprises at least one of $NF_3$ or $SF_6$.

* * * * *